(12) United States Patent
Cho

(10) Patent No.: US 9,179,565 B2
(45) Date of Patent: Nov. 3, 2015

(54) PORTABLE ELECTRONIC DEVICE HOLDER

(75) Inventor: Sung-mok Cho, Seoul (KR)

(73) Assignee: Sung-mok Cho, Seoul (KR)

( * ) Notice: Subject to any disclaimer, the term of this patent is extended or adjusted under 35 U.S.C. 154(b) by 0 days.

(21) Appl. No.: 13/993,280

(22) PCT Filed: Jan. 4, 2012

(86) PCT No.: PCT/KR2012/000091
§ 371 (c)(1),
(2), (4) Date: Jun. 11, 2013

(87) PCT Pub. No.: WO2012/096471
PCT Pub. Date: Jul. 19, 2012

(65) Prior Publication Data
US 2013/0279098 A1    Oct. 24, 2013

(30) Foreign Application Priority Data

Jan. 11, 2011  (KR) .................... 20-2011-0000256 U
Sep. 28, 2011  (KR) .................... 20-2011-0008720 U
Jan. 4, 2012  (KR) ........................ 10-2012-0000965

(51) Int. Cl.
*A45F 5/00* (2006.01)
*H04M 1/04* (2006.01)
(Continued)

(52) U.S. Cl.
CPC *H05K 7/00* (2013.01); *G06F 1/163* (2013.01); *G06F 1/166* (2013.01); *G06F 1/1626* (2013.01);
(Continued)

(58) Field of Classification Search
CPC .... H04M 1/04; A45F 5/00; A45F 2200/0516; A45F 2200/0525; H04B 2001/3861; E05D 11/082

USPC ................ 224/217, 930; 294/25; 24/265 CD; 410/101, 102, 106; 403/78, 133, 135, 403/120, 121; 16/2.1–2.5, 375, 337, 342
See application file for complete search history.

(56) References Cited

U.S. PATENT DOCUMENTS 471,854 A  *  3/1892  Gareis ........................... 224/217
3,866,873 A  *  2/1975  Bohli ............................. 248/544
(Continued)

FOREIGN PATENT DOCUMENTS

JP         3003067         8/1994
JP      2002-199070        7/2002
(Continued)

OTHER PUBLICATIONS

Ultra Recommended "Bunker Ring" is . . . finally Sumafo tablet PC[online]. Urban Design Co., Ltd., Aug. 9, 2011. Retrieved from the Internet: <URL:http://ameblo.jp/ud1192/entry-10980567189.html>.
(Continued)

*Primary Examiner* — Justin Larson
(74) *Attorney, Agent, or Firm* — IP & T Group LLP

(57) ABSTRACT

The present invention relates to a portable electronic device holder which is attached to the rear surface of a smartphone or tablet computer in such a way as to help the user to stably hold the same. The holder according to an embodiment of the present invention includes: a base plate having an adhesive pad which is removably attached to a rear surface of the portable electronic device; a ring to be placed on a finger of a user to allow the user to hold the electronic device; and a connector which is provided with the ring and is fitted into a coupling hole of the base plate so that the holder is integrally coupled to a rear surface of the base plate. The present invention can prevent the user from dropping the electronic device through carelessness.

3 Claims, 35 Drawing Sheets

(51) Int. Cl.
*H05K 7/00* (2006.01)
*G06F 1/16* (2006.01)
*H04B 1/3827* (2015.01)

(52) U.S. Cl.
CPC ................ *H04B 1/385* (2013.01); *H04M 1/04* (2013.01); *A45F 5/00* (2013.01); *A45F 2200/0516* (2013.01); *H04B 2001/3861* (2013.01)

(56) References Cited

U.S. PATENT DOCUMENTS

| | | | | |
|---|---|---|---|---|
| 4,020,527 | A | * | 5/1977 | O'Neill ............................ 16/430 |
| 5,774,948 | A | * | 7/1998 | Petschke et al. ......... 24/265 CD |
| 6,030,159 | A | | 2/2000 | Herrick et al. ................. 410/102 |
| 6,085,388 | A | | 7/2000 | Kaneko ............................ 16/338 |
| D454,691 | S | * | 3/2002 | Proot et al. ..................... D3/318 |
| 6,550,108 | B2 | | 4/2003 | Pratl ............................... 24/3.13 |
| 6,869,053 | B2 | | 3/2005 | Adams, IV ................ 248/206.2 |
| D641,154 | S | * | 7/2011 | Smith ........................... D3/218 |
| D647,085 | S | | 10/2011 | Chung et al. ................. D14/250 |
| 8,479,990 | B2 | * | 7/2013 | Chiarini ......................... 235/439 |
| 8,548,536 | B1 | * | 10/2013 | Gunnip ..................... 455/575.1 |
| 8,622,447 | B1 | * | 1/2014 | Wirtz .............................. 294/25 |
| 8,887,970 | B2 | * | 11/2014 | Tsai et al. ..................... 224/217 |
| 2001/0040202 | A1 | | 11/2001 | Adams, IV |
| 2009/0090750 | A1 | * | 4/2009 | Alcenat ......................... 224/101 |
| 2009/0283559 | A1 | | 11/2009 | Foggiato |
| 2011/0266316 | A1 | * | 11/2011 | Ghalib et al. ................. 224/217 |
| 2013/0146625 | A1 | * | 6/2013 | Karle et al. ................... 224/217 |
| 2013/0148271 | A1 | * | 6/2013 | Huang ..................... 361/679.01 |
| 2013/0210503 | A1 | * | 8/2013 | Keesling et al. ........... 455/575.1 |
| 2014/0027482 | A1 | * | 1/2014 | Crawford et al. ............. 224/197 |
| 2014/0084034 | A1 | * | 3/2014 | Wangercyn et al. .......... 224/217 |
| 2014/0117177 | A1 | * | 5/2014 | Shamsadov ............... 248/205.1 |

FOREIGN PATENT DOCUMENTS

| | | |
|---|---|---|
| JP | 2002-522935 | 7/2002 |
| JP | 3098360 | 9/2003 |
| JP | 3105170 | 8/2004 |
| JP | 2005-348385 | 12/2005 |
| JP | 2006-279907 | 10/2006 |
| JP | 2007-053603 | 3/2007 |
| JP | 2008-131154 | 6/2008 |
| KR | 20-0307473 | 3/2003 |
| KR | 20-2010-0003762 | 4/2010 |
| KR | 101062570 | 9/2011 |

OTHER PUBLICATIONS

Launched Sep. 15 Bunker Ring! [online]. Urban Design Co., Ltd., Sep. 13, 2011. Retrieved from the Internet: <URL:http://ameblo.jp/ud1192/entry-11016336621.html>.

Smart Phone Goods sense new Bunker Ring'll awesome [online]. Urban Design Co., Ltd., Jul. 21, 2011. Retrieved from the Internet: <URL:http://ameblo.jp/ud1192/entry-10960853490.html>.

Ultra Recommended for iPhone • iPad • smartphone tablet PC! [online]. Urban Design Co., Ltd., Aug. 3, 2011. Retrieved from the Internet: <URL:http://ameblo.jp/ud1192/entry-10974331691.html>.

Ring Stand Case (iPhone 3G / 3GS for • iPod touch 2nd for)—Rock Ridge Sound [online]. PodSelection.com, Jul. 16, 2009. Retrieved from the Internet: <URL: http://podselection.com/archives/product/case/ring_stand_case_for_iphone_3g_3gs_and_ipod_touch_2nd_rockridgesound.html>.

IPhone / touch for protective case which lock ridge, even in a simple stand [online]. ITmedia LifeStyle, Jul. 13, 2009. Retrieved from the Internet: <URL:http://www.itmedia.co.jp/lifestyle/articles/0907/13/news036.html>.

[Bunkering review ] received Ripper for iPhone 4 + bunkering combination [online]. Sep. 21, 2011. Retrieved from the Internet: <URL: http://blog.naver.com/nunata7707/30118801224>.

Bunker Ring [bunkering] iPhone 4 seconds accessories[online]. Sep. 21, 2011. Retrieved from the Internet: <URL:http://blog.naver.com/nunata7707/30118796098>.

* cited by examiner

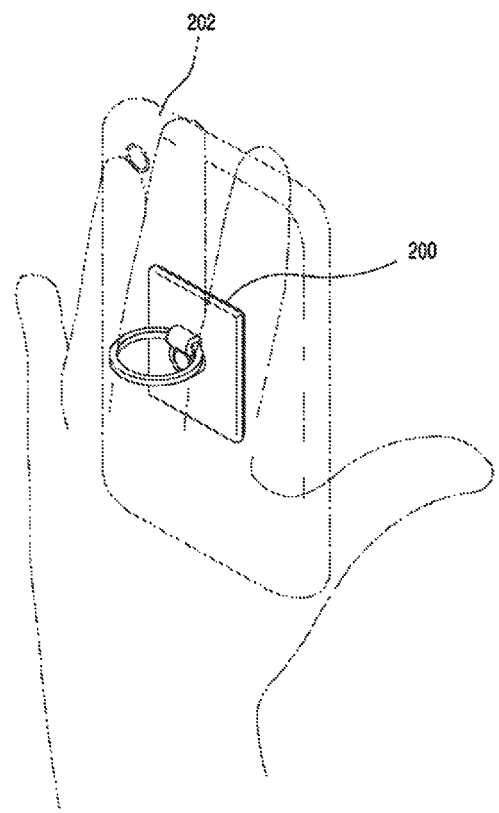

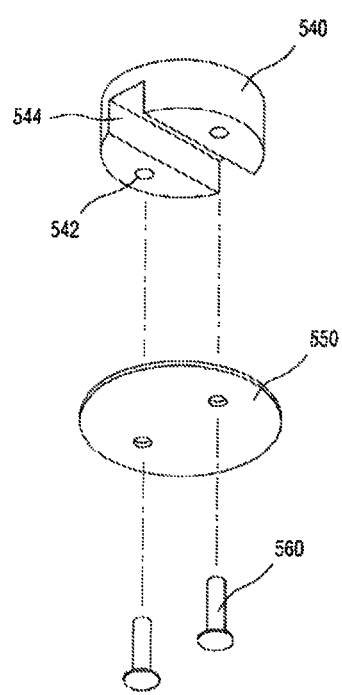

PORTABLE ELECTRONIC DEVICE HOLDER

CROSS-REFERENCE TO RELATED APPLICATIONS

This application is a national stage application of PCT/KR2012/000091 filed on Jan. 4, 2012, which claims priority of Korean patent application number 20-2011-0000256, 20-2011-0008720, and 10-2012-0000965 filed on Jan. 11, 2011, Sep. 28, 2011, and Jan. 4, 2012, respectively. The disclosure of each of the foregoing applications is incorporated herein by reference in its entirety.

TECHNICAL FIELD

The present invention relates, in general, to portable electronic device holders and, more particularly, to a portable electronic device holder which is attached to a rear surface of a portable electronic device such as a smartphone, a tablet computer, etc. to enable a user to stably hold the portable electronic device.

BACKGROUND ART

Recently, the market for portable electronic devices such as smartphones, tablet computers, etc. has been increasingly growing. Users who use portable electronic devices are also interested in associated accessories. As examples, there are display protection films, different kinds of protective casings, etc. Particularly, the reason why a protective casing is used for such an electronic device is because, for example, when the electronic device falls, damage to the electronic device can be reduced, at least somewhat. However, such conventional casings are provided to protect electronic devices when falling events occur, rather than preventing the falling events from occurring.

An example of a conventional technique was proposed in Korean Utility Model Application No. 20-2008-0013117 (Application date; Sep. 30, 2008), entitled "Cellular phone holder". This technique will be explained with reference to FIG. 1.

The cellular phone holder according to the conventional technique includes: a rotating member 100 which is attached at one side thereof to a rear surface of a cellular phone and includes a pair of disk 110 and 120 the central portions of which are connected to each other so as to be rotatable with respect to each other; a planar fastening member 200 which is fastened to the other side of the rotating member 100; and a holding strap which is made of an elastic material such as rubber, and opposite ends of which are coupled to respective opposite ends of the planar fastening member 200. When using the cellular phone, a user can place some fingers in the holder and thus more stably hold the cellular phone.

This conventional cellular phone holder is configured for the user to be required to use the entirety of one hand. Furthermore, in the associated specification, the coupling of the holding strap to the planar fastening member is not clearly illustrated.

Moreover, the conventional cellular phone holder merely enables the user to hold the cellular phone but cannot be used as a means for placing the cellular phone on a support surface such as a table at an inclination angle, for example, when the user watches audiovisual content using the cellular phone. In other words, even if the cellular phone is placed on the support surface at an inclination angle using the cellular phone holder, it cannot provide an appropriate angle at which the cellular phone is placed.

DISCLOSURE

Technical Problem

Accordingly, the present invention has been made keeping in mind the above problems occurring in the prior art, and an object of the present invention is to provide a holder which has two functions of making it possible for a user to conveniently and stably hold a portable electronic device, and for the portable electronic device to be placed on a support surface at an inclination angle.

Technical Solution

In order to accomplish the above object, in a first embodiment, the present invention provides a holder for a portable electronic device, including: a base plate having an adhesive pad on a lower surface thereof, the adhesive pad being attached to a rear surface of the portable electronic device; and an annular holding part having a ring to be placed on a finger of a user, and a coupling protrusion provided on a lower end of the ring, the coupling protrusion being inserted into and coupled to the coupling hole, A 'C'-shaped retainer ring is tightly fitted over a circumferential outer surface of an end of the coupling protrusion that has been inserted into the coupling hole.

In a second embodiment, a locking stopper may be provided on an end of the coupling protrusion.

In a third embodiment, the coupling hole may have: a through hole having a predetermined diameter so that the locking stopper of the coupling protrusion can be inserted into the through hole; and a slide slot extending from the through hole.

In a fourth embodiment, the base plate and the annular holding part may be coupled to each other by a snap button coupling structure.

In a fifth embodiment, the present invention provides a holder for a portable electronic device, including: a base plate having an adhesive pad on a lower surface thereof, the adhesive pad being removably attached to a rear surface of the portable electronic device; a connector having a rotating plate coupled to the base plate so as to be rotatable in a horizontal direction, and a protruding part provided on a circumferential outer edge of the rotating plate, the protruding part having a polygonal through hole; and a ring integrally having a connection part coupled to the polygonal through hole, the connection part having a polygonal cross-section corresponding to the polygonal through hole.

Advantageous Effects

According to the present invention, a user can place a finger in a ring of a holder attached to a rear surface of an electronic device so that the portable electronic device can be conveniently held and used.

Furthermore, the present invention makes it possible for the user to stably hold and use the electronic device without concern of dropping the electronic device.

In addition, because the user can reliably hold the electronic device, it can be fundamentally prevented from falling through carelessness.

Moreover, the holder of the present invention enables the electronic device to be placed on a support surface such as a table at a desired inclination angle.

DESCRIPTION OF DRAWINGS

FIGS. 18, 19a and 19b are views showing the usage of the portable electronic device holder according to the fifth embodiment of the present invention;

FIGS. 34 through 36b are views illustrating a portable electronic device holder according to an eighth embodiment of the present invention;

BEST MODE

Figure 1:
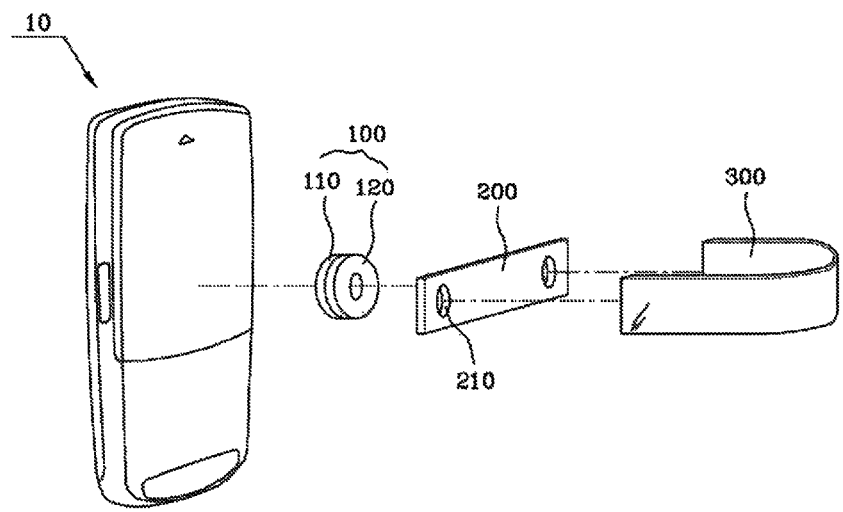
FIG. 1 is a view illustrating a conventional hand holder for cellular phones.
Figure 2:
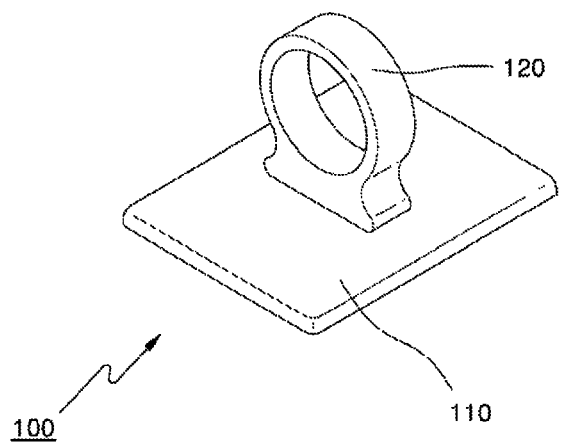
FIGS. 2 through 4 are views illustrating a portable electronic device holder according to a first embodiment of the present invention.
Figure 3:
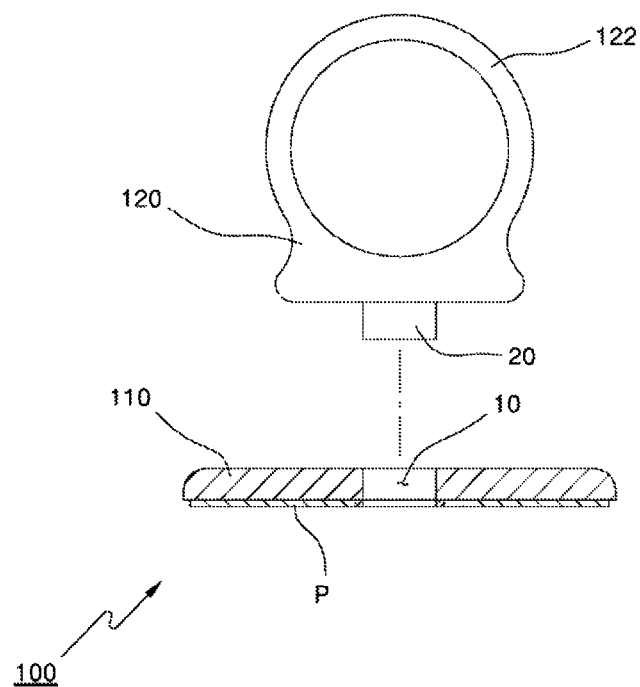
Figure 4:
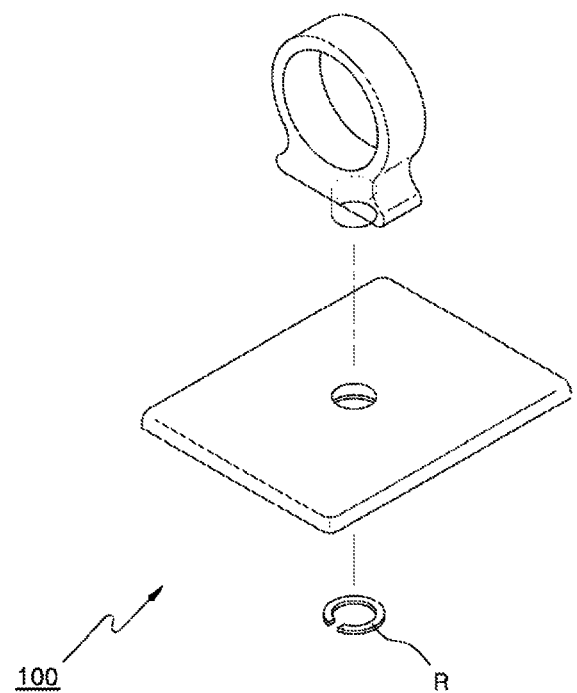

Referring to FIGS. 2 through 4, a portable electronic device holder (hereinafter referred to as 'holder') according to a first embodiment of the present invention is designated by reference numeral 100. The holder 100 includes a base plate 110 and an annular holding part 120.

An adhesive pad P which is removably attached to a rear surface of a portable electronic device (not shown) is provided under the base plate 110. The base plate 110 is not limited to a special shape, and it may preferably have a rectangular shape as shown in the drawings. A coupling hole 10 is formed in the base plate 110.

The annular holding part 120 includes an annular ring 122 and a coupling protrusion 20 which is provided on a lower end of the annular ring 122. The annular ring 122 is placed on a finger (typically, the middle finger or the index finger) of a user.

The ring 122 may have a size such that it is capable of being put on two or more fingers. In other words, the ring 122 may be formed such that two or more fingers, for example, the middle finger and the index finger or the middle finger and the ring finger, can be placed in the ring 122.

The coupling protrusion 20 has a cylindrical shape and is coupled to the coupling hole 10 of the base plate 110. After the coupling, a 'C'-shaped retainer ring R is tightly fitted over a circumferential outer surface of an end of the coupling protrusion 20 so as to prevent the coupling protrusion 20 from being undesirably removed from the coupling hole 10. Thereby, the annular holding part 120 of the first embodiment can be reliably fastened to the base plate 120.

Figure 5:
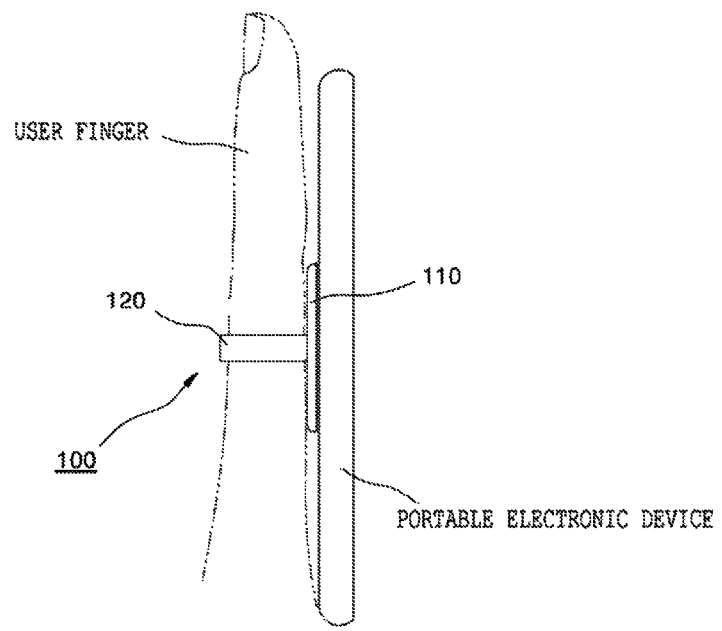
FIGS. 5 through 7 are views showing the usage of the portable electronic device holder according to the present invention.
Figure 6:
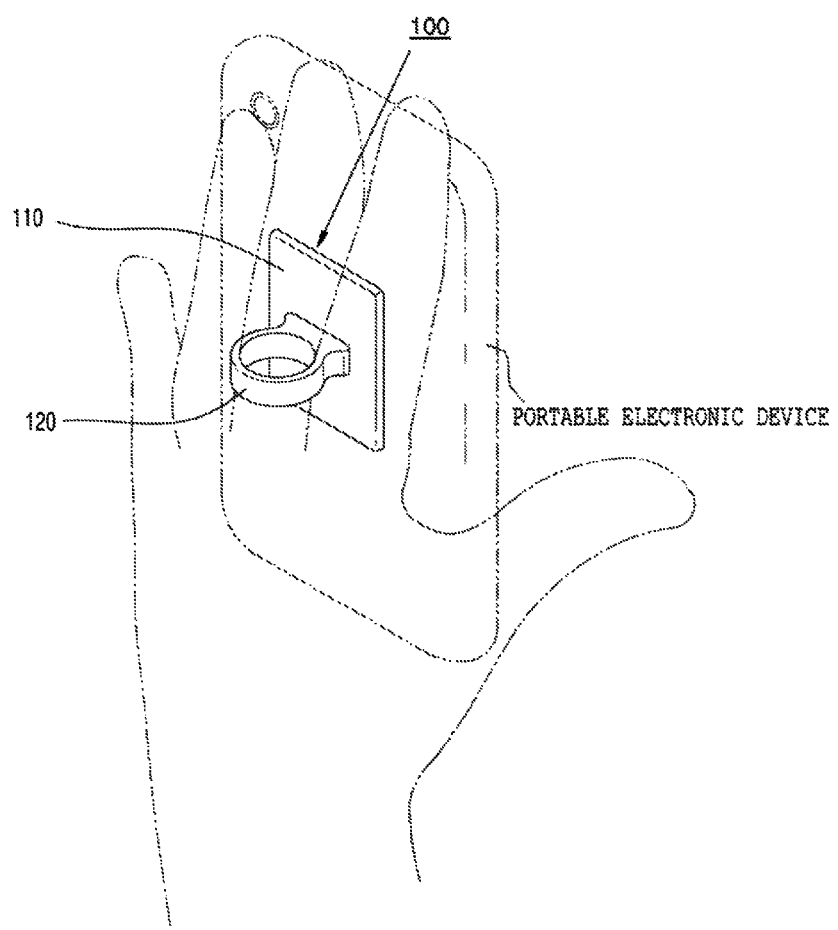
Figure 7:
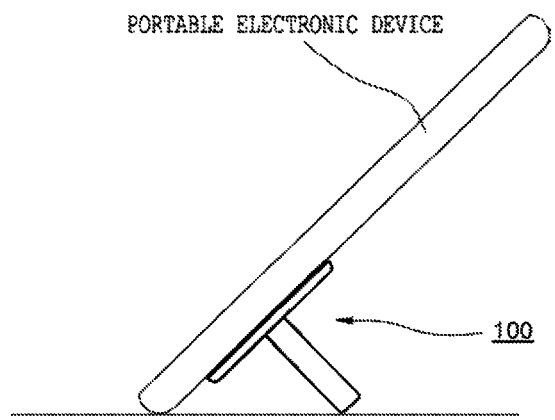

FIGS. 5 through 7 are views showing an example of the usage of the holder according to the present invention. As stated above, the holder 100 is attached to the rear surface of the portable electronic device. The user can put a finger into the annular holding part 120 of the holder 100 and use the electronic device. In this case, the user can use the electronic device without concern of dropping the electronic device through carelessness. Furthermore, as shown in FIG. 7, the holder 100 can function as a simple device rest. For reference, the usage of the holder illustrated, in FIGS. 5 through 7 can also be applied to other embodiments of the present invention in the same manner.

Hereinafter, several other embodiments of the present invention will be explained. In the following description, if possible, the same reference numerals and terminologies of elements as those of the first embodiment will be used for consistency and convenience of explanation. The following embodiments are configured such that the annular holding part 110 is removably coupled to the base plate 120, unlike that of the first embodiment.

Figure 8:
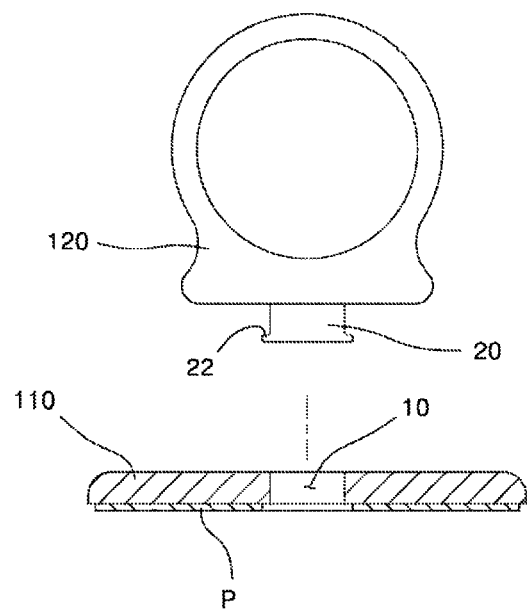
FIG. 8 is a view illustrating a portable electronic device holder according to a second embodiment of the present invention.

FIG. 8 is a view illustrating a holder 100 according to a second embodiment of the present invention. The basic construction of the second embodiment remains the same as that of the first embodiment. A base plate 110 has a coupling hole 10 in the same manner as that of the first embodiment. A coupling protrusion 20 provided with a locking stopper 22 on an end thereof is provided under a lower end of the annular holding part 120. The diameter of a portion of the coupling protrusion 20 that includes the locking stopper 22 is larger than that of the coupling hole 10. The coupling protrusion 20 is tightly fitted into the coupling hole 10 of the base plate 110. Therefore, unlike the first embodiment, the second embodiment does not require a separate 'C'-shaped retainer ring R.

Figure 9:
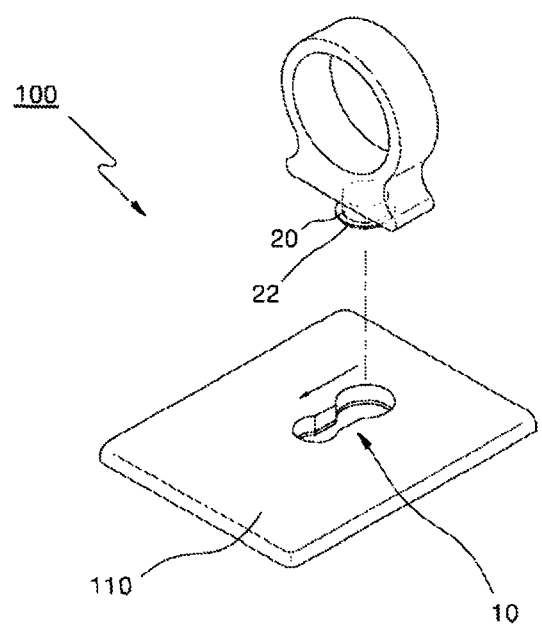
FIGS. 9 and 10 are views illustrating a portable electronic device holder according to a third embodiment of the present invention.
Figure 10:
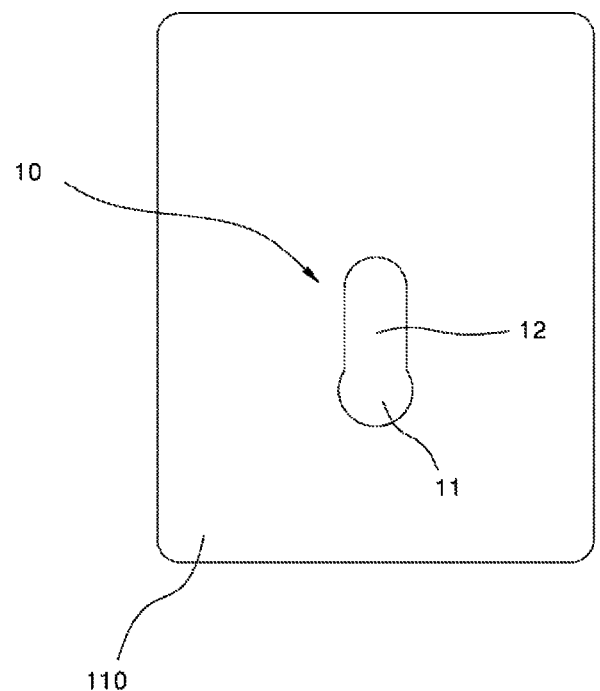

FIG. 9 is a view illustrating a holder 100 according to a third embodiment of the present invention. The basic construction of the third embodiment is the same as that of the second embodiment. However, as shown in FIG. 10, the coupling hole 10 of the base plate 110 has a through hole 11 and a slide slot 12 which extends a predetermined length with a lesser width than the diameter of the through hole 11. A locking stopper 22 of a coupling protrusion 20 can be easily inserted into the through hole 11 without force being applied thereto. After the coupling protrusion 20 has been inserted into the through hole 11, it is pushed, in a sliding manner, in a direction (a longitudinal direction) in which the slide slots 12 extends. Then, the coupling protrusion 20 is not removed from the slide slot 12, because the diameter of the locking stopper 22 is greater than the width of the slide slot 12.

Figure 11:
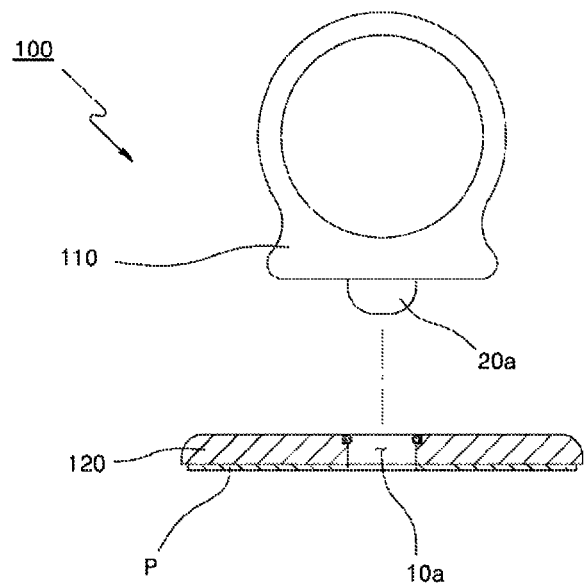
FIG. 11 is a view illustrating a portable electronic device holder according to a fourth embodiment of the present invention.

FIG. 11 is a view illustrating a holder 100 according to a fourth embodiment of the present invention. In the fourth embodiment, an annular holding part 120 is coupled to a base plate 110 by a snap button coupling method. For this, a snap hole 10a is formed in the base plate 110. A snap protrusion 20a which is fitted into the snap hole 10a is provided under a lower end of an annular holding part 120.

Figure 12:
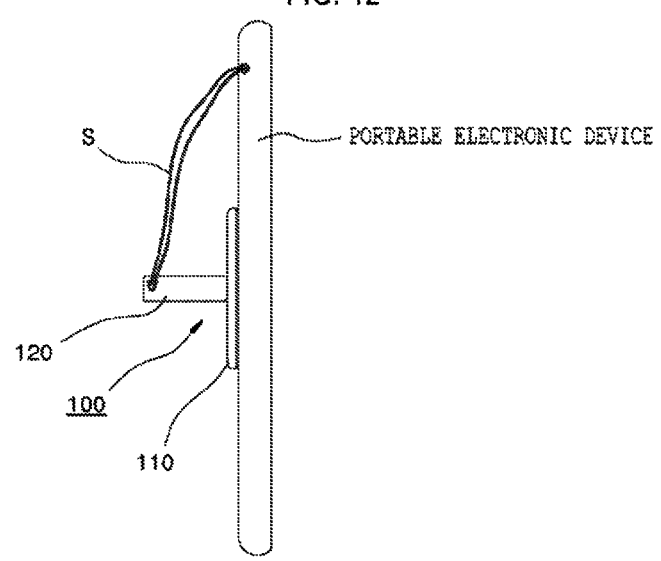
FIG. 12 is a view illustrating an additional element of the portable electronic device holder according to the second through fourth embodiments of the present invention.

As stated above, the holders 100 according to the second through fourth embodiments are configured such that the annular holding part 120 is separably coupled to the base plate 110. Therefore, it is preferable that the holder 100 is provided with an additional means for preventing the annular holding part 120 from being lost after having been separated from the base plate 110. Referring to FIG. 12, the annular holding part 120 is connected to the electronic device by an elastic string S. As such, in the case where the elastic string S connects the annular holding part 120 to the electronic device, the user may place a finger in the annular holding part 120 that was separated from the base plate 110 while using the electronic device.

Meanwhile, a portable electronic device 200 holder according to a fifth embodiment of the present invention is configured such that it can be attached to a rear surface of a portable electronic device 202 such as a smartphone or a tablet computer, whereby the user can easily and stably hold the portable electronic device 202 using a finger.

Figure 13:
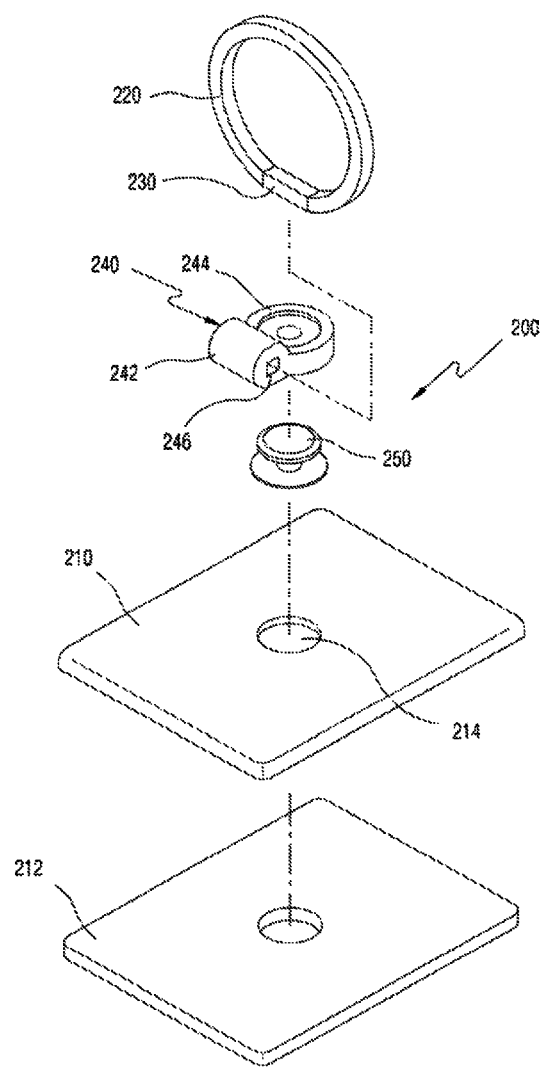
FIGS. 13 and 15 are views illustrating a portable electronic device holder according to a fifth embodiment of the present invention.
Figure 14:
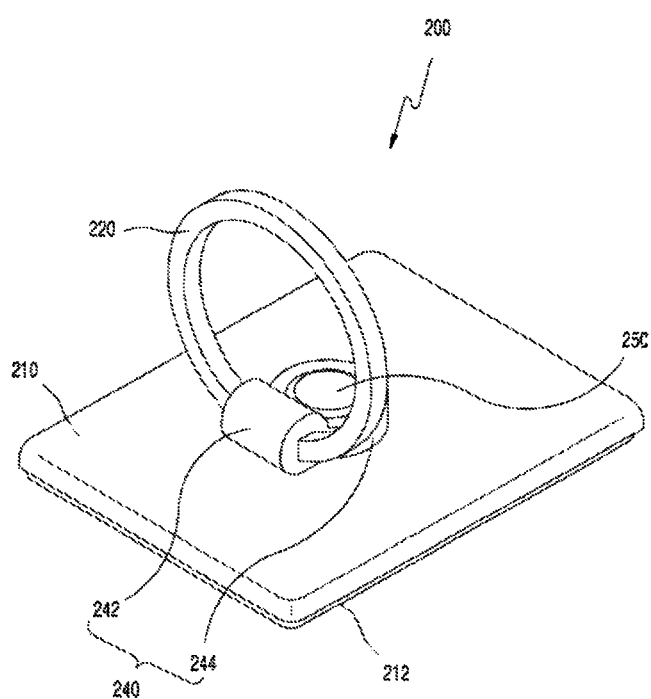
Figure 15:
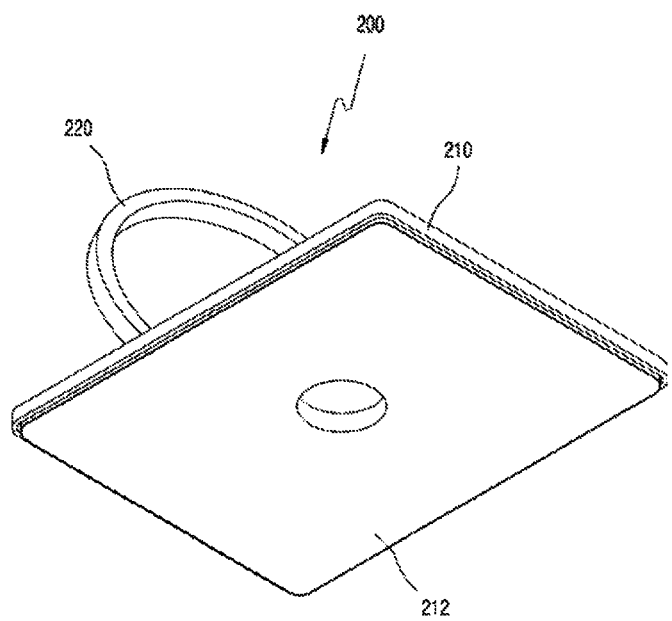

As shown in FIGS. 13 through 15, the holder 200 according to this embodiment includes a base plate 210 provided with an adhesive pad 212, a ring 220 provided with a connection part 230, and a connector 240.

The adhesive pad 212 is provided on a lower surface of the base plate 210 so as to make it possible to removably attach the holder 200 to the rear surface of the portable electronic device 202.

The adhesive pad 212 is directly attached to the portable electronic device 202 and, more preferably, it is reliably adhered to the portable electronic device 202 by an adhesive material applied to the pad 212.

The adhesive pad 212 is protected by non-adhesive paper before it is used. To use the adhesive pad 212, the non-adhesive paper is first removed therefrom before it is adhered to the rear surface of the portable electronic device 202.

In the drawing, although the base plate 210 has been illustrated as having a rectangular shape, it is not limited to a special shape.

A coupling hole 214 is formed in the base plate 210.

The connector 240 provided with the ring 220 is integrally inserted into and coupled to the coupling hole 214 of the base plate 210.

In detail, the connector 240 is coupled to the coupling hole 214 of the base plate 210 by a rotating shaft 250. The connector 240 is configured in such a way that a protruding part 242 is integrally provided on a circumferential outer edge of a rotating plate 244.

The connector 240 is provided with the ring 220 which is used for the user to reliably hold the portable electronic device 202.

The ring 220 has an integrated ring shape having a through hole in which the finger of the user is placed to allow the user to hold the portable electronic device.

The annular ring 220 is placed on a finger (typically, the middle finger or the index finger) of the user.

Moreover, the ring 122 may have a size such that it is capable of being put on two or more fingers. In other words, the ring 122 may be formed such that two or more fingers, for example, the middle finger and the index finger or the middle finger and the ring finger, can be placed in the ring 122.

The connection part 230 having a polygonal shape is formed in a predetermined portion of the ring 220 and is inserted into the protruding part 242 of the connector 240.

The ring 220 has a circular shape, and the connection part 230 is formed by linearly extending a predetermined portion of the circular ring 220.

Figure 16:
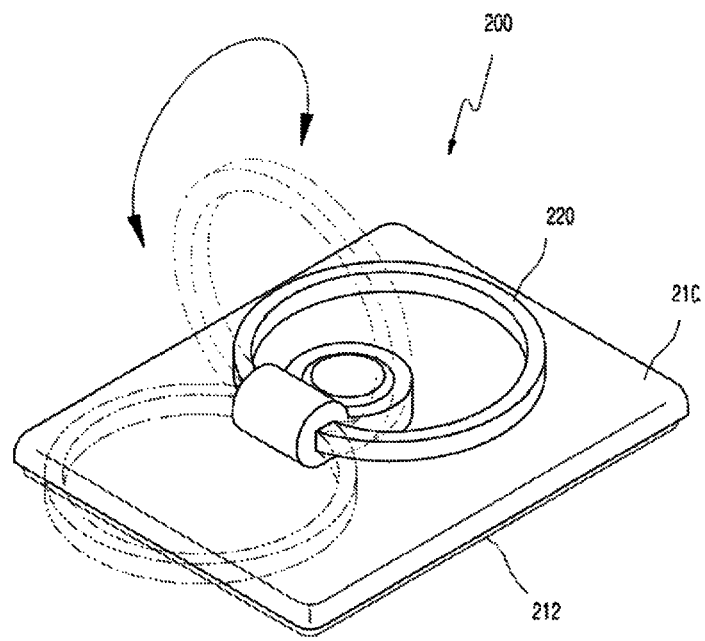
FIGS. 16 and 17 are views showing the operation of the portable electronic device holder according to the fifth embodiment of the present invention.
Figure 17:
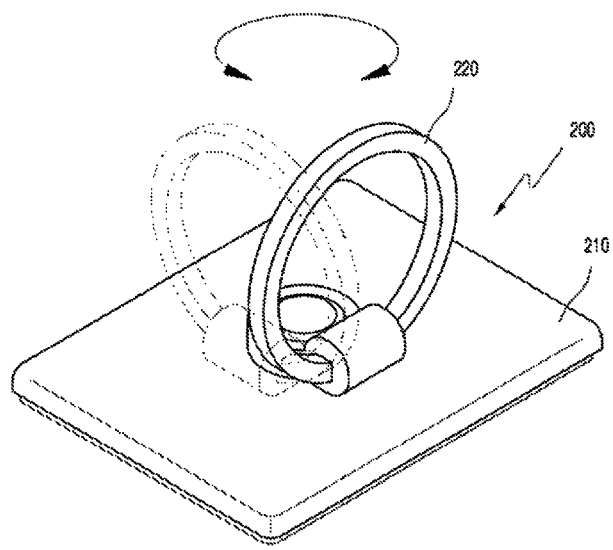

Referring to FIGS. 16 and 17, the connection part 230 is disposed in the protruding part 242 so that the ring 220 can be tilted or rotated with respect to the base plate 210.

Here, the protruding part 242 is made of hard rubber to provide sufficient frictional force with regard to the tilting of the ring 220.

The protruding part 242 has a polygonal through hole 246 corresponding to the connection part 230 therein. The surfaces defining the polygonal through hole 246 make contact and friction with the surfaces of the connection part 230 when the connection part 230 rotates in the protruding part 242.

Each of the connection part 230 and the protrusion part 242 has a polygonal cross-section, which preferably has three or more sides.

Figure 19A:
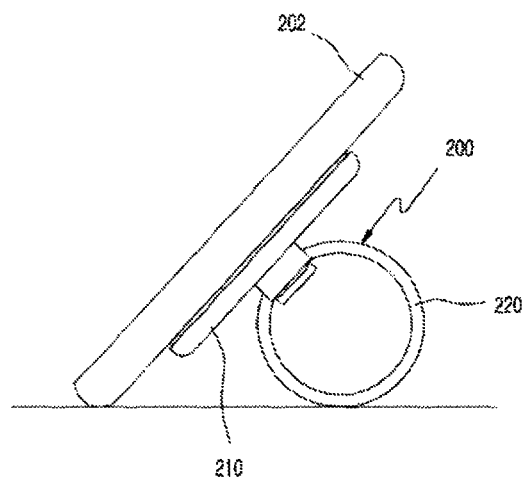
Figure 19B:
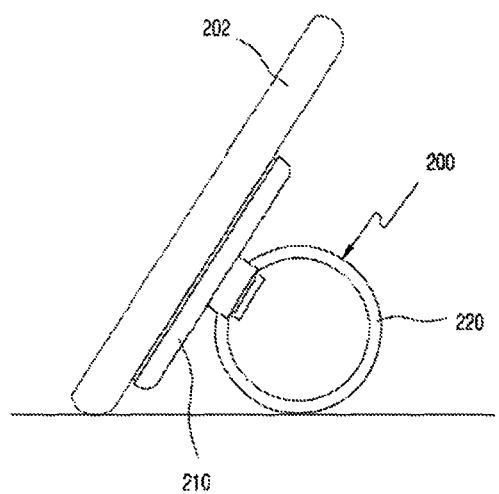

As shown in FIG. 19a and 19b, the holder 200 of the present invention can also function as a simple device rest.

When the holder 200 is placed on the support surface, the ring 220 provides force to support the electronic device 202 so that the electronic device 202 can be placed on the support surface at an inclination angle.

The supporting force of the ring 220 is embodied by the polygonal cross-sectional structures of the connection part 230 and the protruding part 242.

That is, each surface of the polygonal connection part 230 makes direct contact and friction with the corresponding surface of the polygonal protruding part 242, thus forming the supporting force by which the electronic device 202 is supported on the support surface at an inclination angle.

In more detail, if the entirety of the ring 220 is circular, when the electronic device 202 to the rear surface of which the ring 220 is attached is placed at an inclination angle, the supporting force of the ring 220 is insufficient to withstand force applied from the electronic device 202 to the ring 220.

As such, if both the ring and the portion that engages with the ring are circular, frictional force therebetween is reduced, whereby the supporting force of the ring also becomes insufficient.

Furthermore, the ring may be configured in such a way that a portion thereof is cut out, and a rotating protrusion is provided on each of opposite ends of the cut portions of the ring, so that the ring is coupled to the base plate so as to be rotatable around a horizontal axis defined by the rotating protrusions. This case is also disadvantageous in that the horizontal axis structure of the ring is provided only to rotate the ring around the horizontal axis rather than being configured such that the frictional force is increased to provide sufficient support force.

Furthermore, in both cases, if the holder is used over a long period of time and the ring is rotated many times, the junction between the ring and the portion connected to the ring is worn, and the ring may loosely slip, thus causing a problem of the ring spinning with no friction.

To solve these problems, in the present invention, the protruding part 242 of the base plate 210 and the connection part 230 of the ring 220 that is coupled to the protruding part 242 have the polygonal cross-sectional structures so that the ring 220 can be tilted on the base plate 210 by predetermined angles.

Thereby, the electronic device 202 can be easily placed on the support surface such as an upper surface of a table at a predetermined inclination angle.

Meanwhile, the protruding part 242 is integrally connected to the circumferential outer edge of the rotating plate 244 of the connector 240. The rotating plate 244 is fitted into the coupling hole 214 of the base plate 210 to provide a structure such that the connector 240 is integrally attached to the surface of the base plate 210.

In detail, the connector 240 is configured to be integrally attached to the surface of the base plate in such a way that the rotating shaft 250 is coupled to the coupling hole 214 of the base plate 210.

As such, the connector 240 is coupled to the coupling hole 214 of the base plate 210 by the shaft so as to be rotatable.

The connector 240 is provided on the rear surface of the base plate 210 so as to be rotatable by 360² with respect to the base plate 210. Thus, the ring 220 can be rotated around the rotating shaft 250 that is provided in the base plate 210.

The ring 220 is coupled to the protruding part 242 of the connector 240 so as to foe rotatable by 180°.

The ring 220 can be horizontally rotated around the rotating shaft 250 by 360² on the rear surface of the base plate 210 and vertically rotated around the protruding part 242 by 180°.

For this, the ring 220 is placed in the protruding part such that sufficient fractional force is generated, therebetween, in other words, the ring 220 is prevented from being loosely rotated with respect to the protruding part, whereby only when it is intended to rotate the ring 220 can it be rotated with respect to the protruding part.

Meanwhile, FIG. 18 is a view illustrating the usage of the holder 200 of the present invention. The holder 200 is attached to the rear surface of the portable electronic device 202, as stated above. The user places a finger in the ring 220 of the holder 200 when using the electronic device 202.

Thereby, the user can use the electronic device 202 without concern of dropping the electronic device through carelessness.

Figure 20:
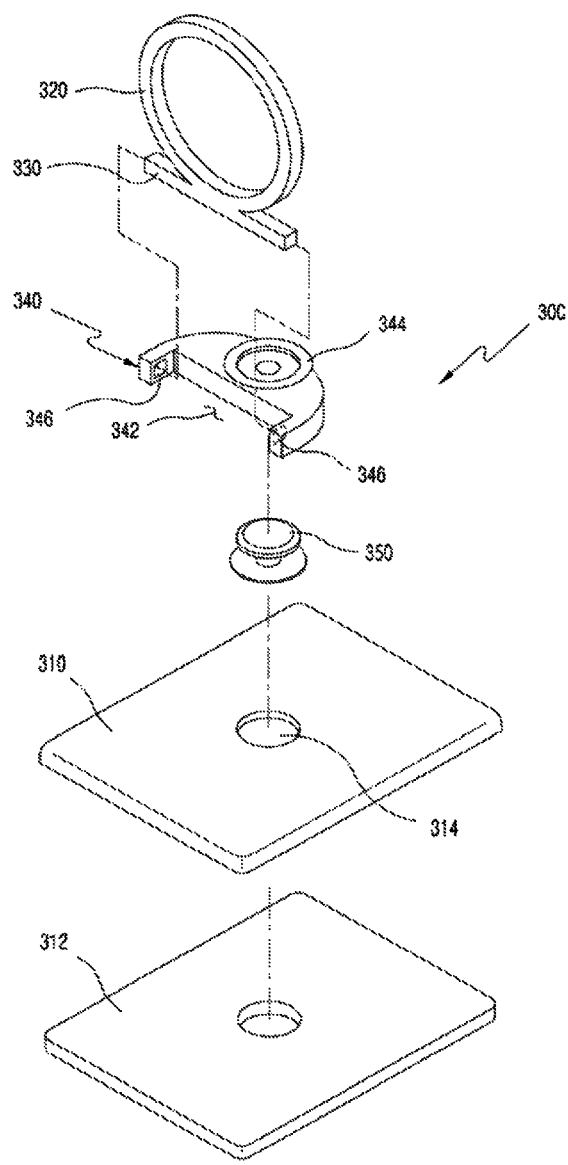
FIGS. 20 and 21 are views illustrating a portable electronic device holder according to a sixth embodiment of the present invention.
Figure 21:
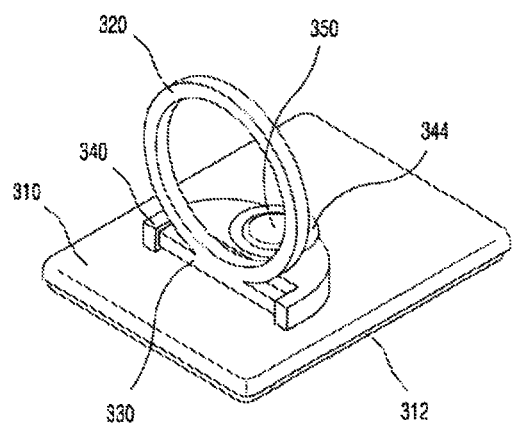

FIGS. 20 and 21 are views illustrating the construction of a sixth embodiment of the present invention. The sixth embodiment provides a holder 300 which allows the user to more easily and stably hold it compared to the holder 200 of the fifth embodiment.

The holder 300 according to the sixth embodiment is attached to the rear surface of an electronic device such as a smartphone or a tablet computer to enable the user to easily and stably hold the electronic device.

The holder 300 includes a base plate 310 provided with an adhesive pad 312, a rotating plate 344, a coupling bracket 340 and a ring 320.

The adhesive pad 312 is provided on a lower surface of the base plate 310 so as to make it possible to removably attach the holder 300 to the rear surface of the portable electronic device 302.

The adhesive pad 312 is directly attached to the portable electronic device 302 and, more preferably, it is reliably adhered to the portable electronic device 302 with an adhesive material applied to the pad 312.

A coupling hole 314 is formed in the base plate 310.

A rotating shaft 350 is inserted into the coupling hole 314 of the base plate 310 so as to be horizontally rotatable on the base plate 310. The coupling bracket 340 which is made of rubber extends from the circumferential outer edge of the rotating plate 350 in one direction.

The coupling bracket 340 has an approximate 'U' shape. A cut space 342 is formed in a medial portion of the connection 340. A polygonal rotating depression 346 is formed in each of the opposite inner surfaces of the space 342.

The ring 320 is coupled to the coupling bracket 340.

Figure 22:
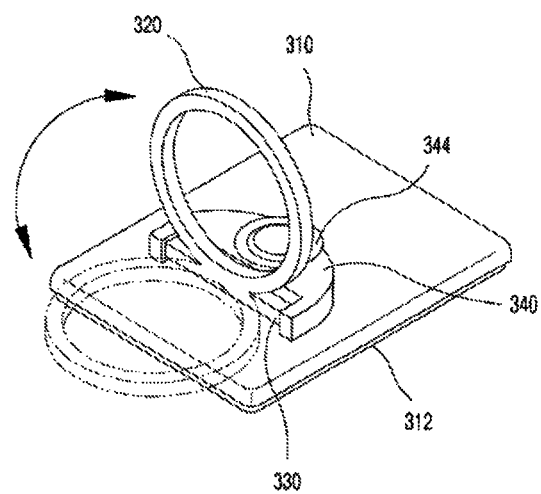
FIGS. 22 and 23 are views showing the operation of the portable electronic device holder according to the sixth embodiment of the present invention.

With regard to the coupling of the ring 320 to the coupling bracket 340, as shown in FIG. 22, the ring 320 integrally includes a rotating bar 330 which is coupled to the rotating depressions 346 formed in the opposite side surfaces of the coupling bracket 340 so that the ring 320 can be rotated by 90²0 around the rotating bar 330.

The rotating bar 330 horizontally protrudes from a portion of the ring 320 outwards in opposite directions, and the opposite ends of the rotating bar 330 are inserted into the respective rotating depressions 346.

The rotating bar 330 has the same polygonal cross-section. as that of the rotating depression 346.

With regard to the term 'polygonal cross-section', the polygonal rotating bar 330 preferably has at least three sides.

The rotating bar 330 is disposed in the space 342 of the coupling bracket 340 and has a shape such that it horizontally extends outwards from a portion of the ring 320 that has a circular shape.

Furthermore, the rotating bar 330 is inserted into the rotating depressions 346 formed on opposite sides of the space 342 so that the ring 320 can be tilted with respect to the base plate 310.

Here, the coupling bracket 340 is made of hard rubber to provide sufficient frictional force with regard to the tilting of the ring 320.

Each rotating depression 346 of the coupling bracket 340 has a polygonal cross-section corresponding to that of the rotating bar 330. The surfaces defining each rotating depression 346 make direct contact and friction with the surfaces of the rotating bar 330 when the rotating bar 330 rotates with respect to the rotating depressions 346.

Figure 25:
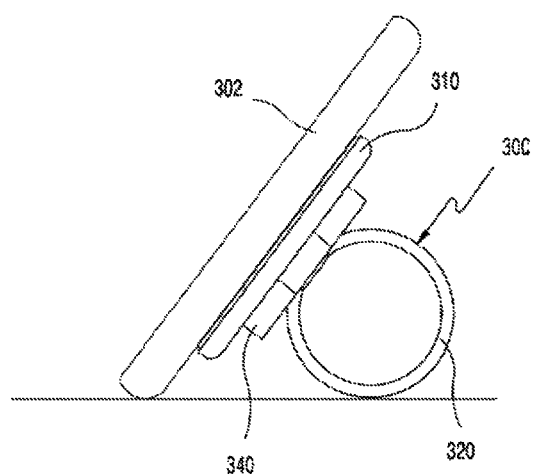
Figure 26:
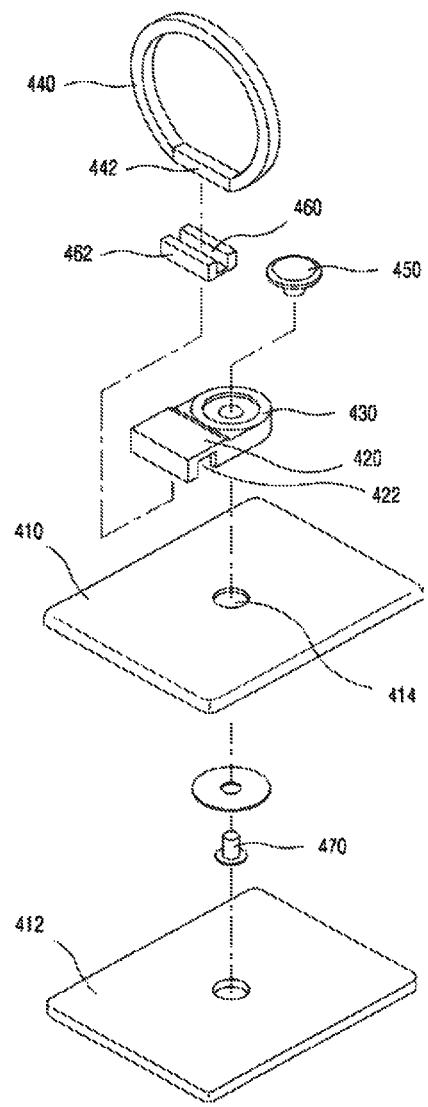
FIGS. 26 through 28b are views illustrating a portable electronic device holder according to a seventh embodiment of the present invention.
Figure 27:
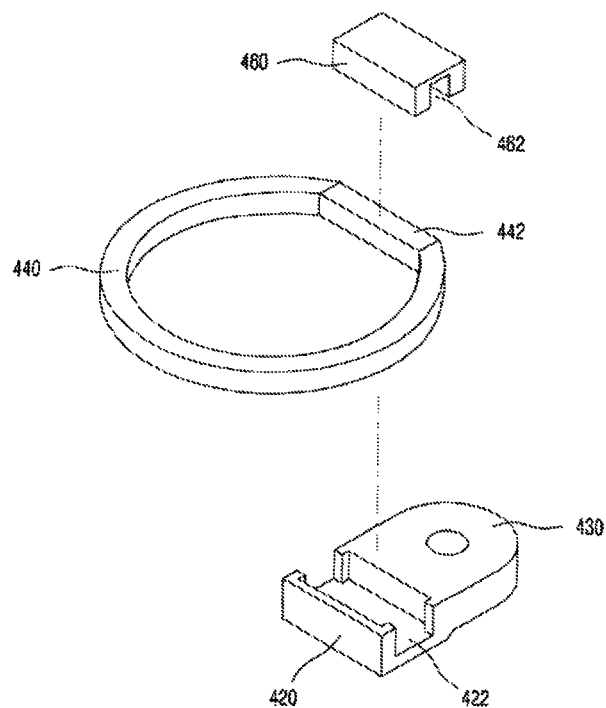
Figure 28A:
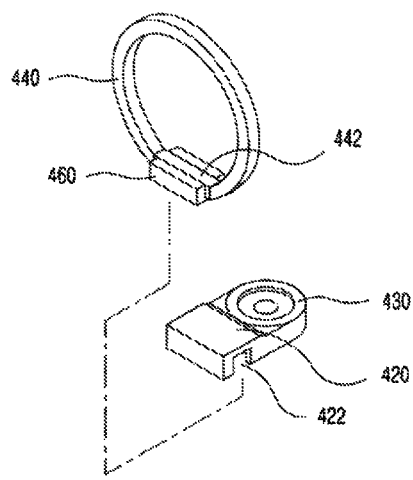
Figure 28B:
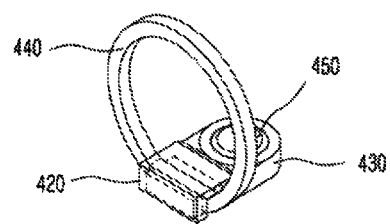

Referring to FIG. 25, the holder 300 provides supporting force using friction contact so that, when the electronic device 302 is placed on the support surface at a predetermined inclination angle, the holder 300 can support the electronic device 302 with a predetermined supporting force.

Thereby, the electronic device 302 can be easily placed on the support surface such as an upper surface of a table at a predetermined inclination angle.

Figure 23:
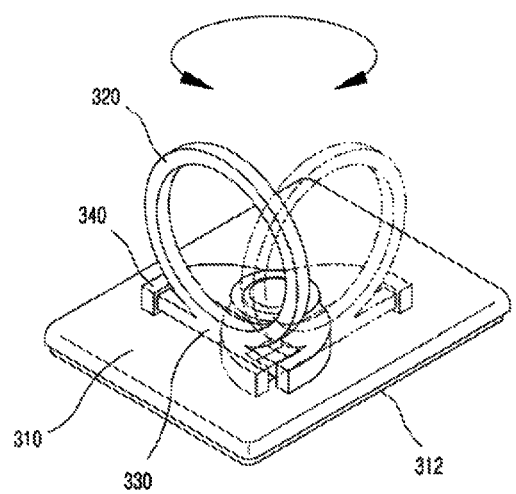

As shown in FIGS. 22 and 23, the ring 320 can be horizontally rotated around the rotating shaft 350 by 360²0 on the rear surface of the base plate 310 and vertically rotated around the coupling bracket 340 by 90°.

Figure 24:
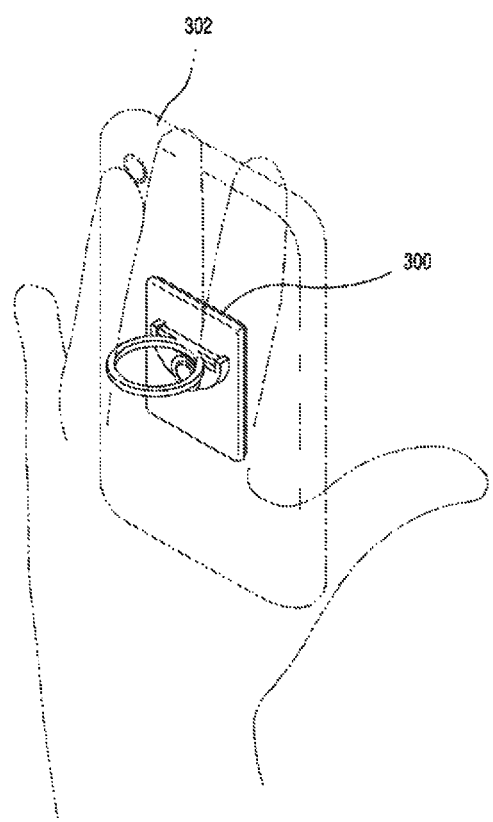
FIGS. 24 and 25 are views showing the usage of the portable electronic device holder according to the sixth embodiment of the present invention.

As shown in FIG. 24, when using the ring 320 attached to the rear surface of the portable electronic device 302, the user places a finger in the ring 320 of the holder 300 and then is able to conveniently use the electronic device 302. Thereby, the user can use the electronic device 302 without concern of dropping the electronic device through carelessness.

Furthermore, although the ring 320 is rotatably provided, only when it is intended to rotate the ring 320 can it be rotated vertically or horizontally on the base plate. For this, the ring 320 is coupled to the base plate such that sufficient frictional force is generated therebetween, in other words, the ring 320 is prevented from loosely rotating with respect to the base plate.

As a result, the user can use the electronic device 302 provided with the holder 300 without concern of dropping the electronic device through carelessness.

FIGS. 26 through 28b are views illustrating the construction of a seventh embodiment of the present invention.

A holder 400 according to the seventh embodiment of the present invention includes a base plate 410 provided with an adhesive pad 412, a rotating plate 430, a coupling block 420, a ring 440 and a rotating sleeve 460.

The adhesive pad 412 is provided on a lower surface of the base plate 410 so as to make it possible to removably attach the holder 400 to the rear surface of a portable electronic device 402.

A coupling hole 414 is formed in the base plate 410.

A rotating shaft 450 is inserted into the coupling hole 414 of the base plate 410 so as to be horizontally rotatable on the base plate 410. The coupling block 420 integrally extends from the circumferential outer edge of the rotating plate 430 in one direction.

The ring 440 is coupled to the coupling block 420 and can be rotated around the rotating shaft 450 on the base plate 410.

The coupling block 420 integrally extends from the rotating plate 430 in one direction and has a multi-bend reverse U-shaped cross-sectional shape.

That is, the coupling block 420 has a lower depression 422 which has a polygonal cross-section and is open on a lower end and opposite sides thereof.

The ring 440 along with the rotating sleeve 460 is coupled to the lower depression 422.

The ring 440 includes a connection part 442 which has the same polygonal cross-sectional shape as that of the lower depression 422.

The rotating sleeve 460 has an upper depression 462 which has a polygonal cross-sectional shape and is open on an upper end and opposite sides thereof so that the connection part 442 of the ring 440 can be disposed in the rotating sleeve 460.

Here, the lower depression 422 of the coupling block 420, the connection part 442 of the ring 440 and the upper depression 462 of the rotating sleeve 460 have the same polygonal cross-sectional shape.

The ring 440 and the rotating sleeve 460 are made of rubber and are coupled to the coupling block 420. The rotating sleeve 460 to which the connection part 442 of the ring 440 is coupled is installed in the lower depression 422 of the coupling block 420.

In detail, the rotating sleeve 460 is coupled to the connection part 442 of the ring 440, and the ring 440 and the rotating sleeve 460 are installed in the lower depression 422 of the coupling block 420.

Here, the order of the assembly process may be changed. For example, the assembly process may be conducted in such a way that, after the connection part 442 of the ring 440 is disposed in the coupling block 420, the rotating sleeve 460 is inserted into the lower depression 422 of the coupling block 420 while the upper depression 462 is fitted over the connection part 442 of the ring 440.

Meanwhile, the rotating plate 430 along with the coupling block 420 is coupled to the base plate 410. A fastening member 470 using a vertical coupling structure is used to couple the rotating plate 430 to the coupling hole 414 of the base plate 410.

The coupling block 420 that is integrally provided with the rotating plate 430 is rotated around the fastening member 470.

Figure 29:
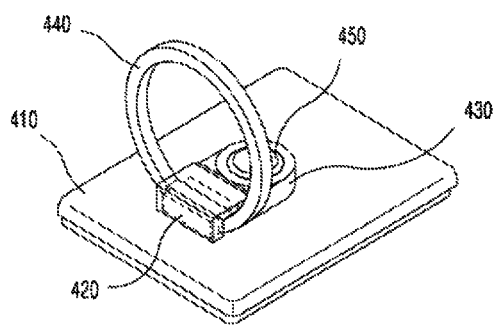
FIGS. 29 through 31 are views showing the operation of the portable electronic device holder according to the seventh embodiment of the present invention.
Figure 30:
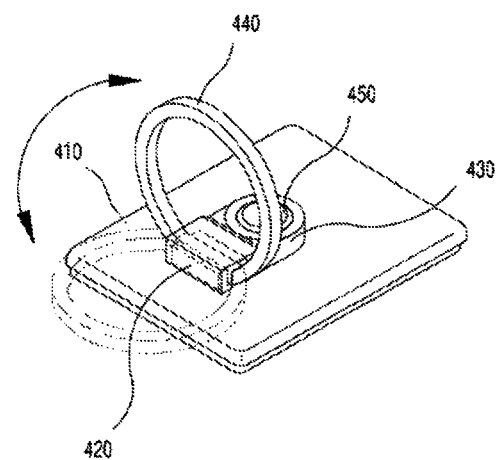
Figure 31:
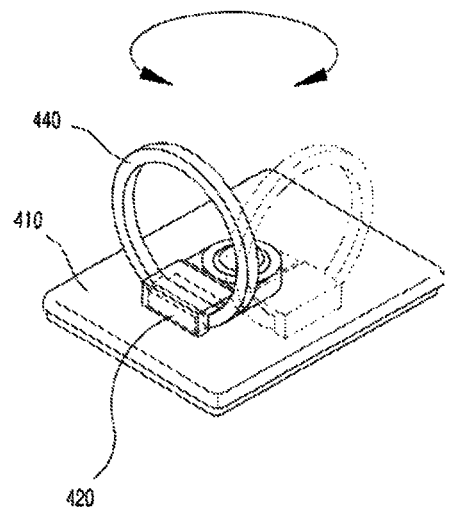

As shown in FIGS. 29 through 31, the coupling block 420 along with the rotating plate 420 is coupled to the base plate 410. The ring 440 coupled to the coupling block 420 can be rotated by 180 around the rotating sleeve 460.

The ring 440 can be rotated by predetermined angles.

The ring 440 can be rotated around the rotating plate 430 by 360 on the rear surface of the base plate 410.

Figure 32:
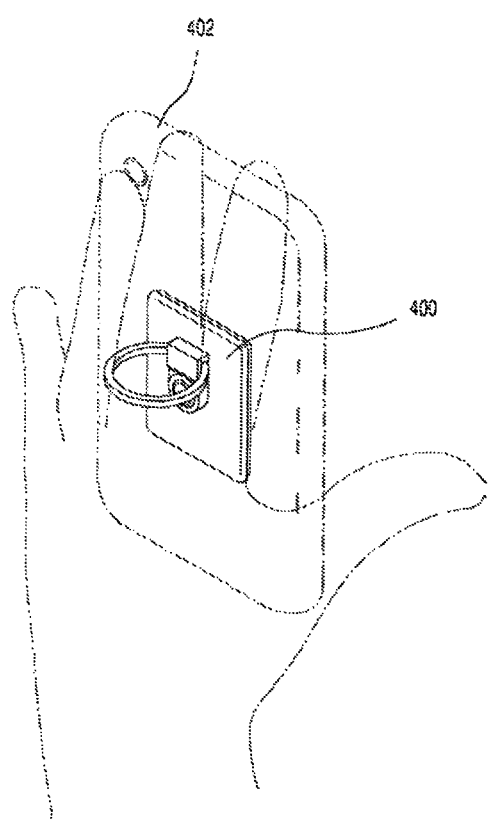
FIGS. 32 and 33 are views showing the usage of the portable electronic device holder according to the seventh embodiment of the present invention.

Furthermore, as shown in FIG. 32, using the ring 440 attached to the rear surface of the portable electronic device 402, the user places a finger in the ring 440 of the holder 400 and then is able to conveniently use the electronic device 402.

Figure 33:
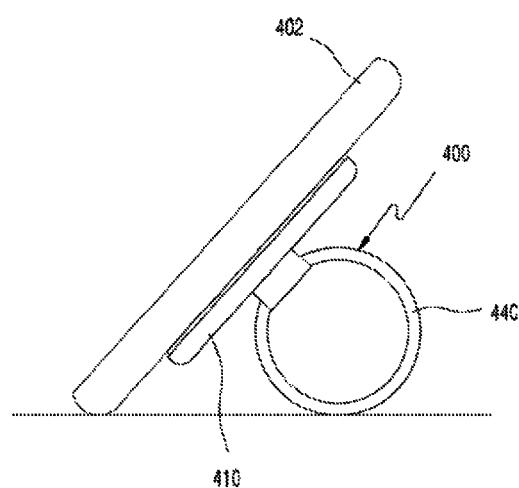
Figure 34:
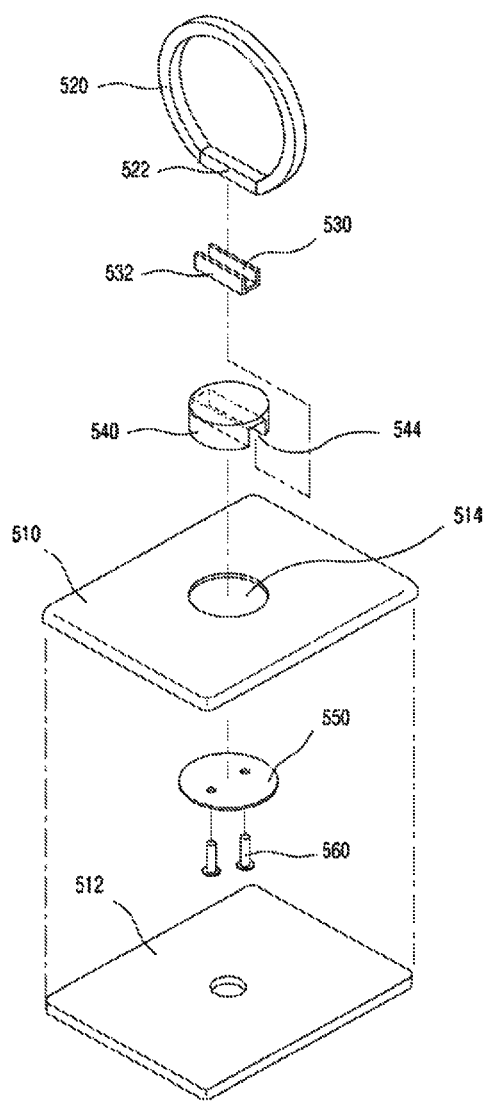
Figure 36A:
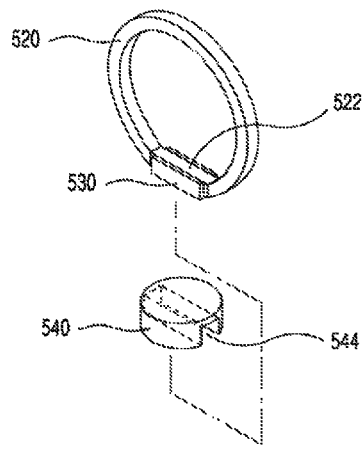
Figure 36B:
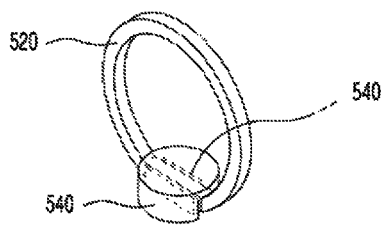

Referring to FIG. 33, the holder 400 provides supporting force using friction contact so that, when the electronic device 402 is placed on the support surface at a predetermined inclination angle, the holder 400 can support the electronic device 402 with a predetermined supporting force.

Thereby, the electronic device 402 can be easily placed on the support surface such as an upper surface of a table at a predetermined inclination angle.

FIGS. 34 through 36b are views showing the construction of an eighth embodiment of the present invention.

The holder 500 according to the eighth embodiment includes a base plate 510 provided with an adhesive pad 512, a ring 520, a sleeve 530, a rotating cap 540 and a fastening plate 550.

The adhesive pad 512 is provided on a lower surface of the base plate 510 so as to make it possible to removably attach the holder 500 to the rear surface of a portable electronic device 502.

A coupling hole 514 which has a predetermined size is formed in a central portion of the base plate 510.

The ring 520 has a circular shape and includes a connection part 522 which is formed by linearly extending a predetermined portion of the circular ring 520.

The connection part 522 has a polygonal cross-sectional shape.

The sleeve 530 coupled to the connection part 522 of the ring 520 is made of rubber, and has an upper depression 532 which has a polygonal cross-sectional shape and is open on an upper end and opposite sides thereof so that the connection part 522 of the ring 520 can be disposed in the sleeve 530.

The ring 520 provided with the sleeve 530 is coupled to the base plate 510 by the rotating cap 540.

The rotating cap 540 has the same diameter as that of the coupling hole 514 of the base plate 510, and has a lower depression 544 which has a polygonal cross-section and enables the ring 520 and the sleeve 530 to be inserted into the rotating cap 540 from the lower surface of the rotating cap 540.

The lower depression 544 is formed in a medial portion of the lower surface of the rotating cap 540, and fastening holes 542 are formed in the lower surface of the rotating cap 540 at opposite sides of the lower depression 544.

The lower surface of the rotating cap 540 has a circular shape and is configured such that the fastening holes 542 are disposed on opposite sides of the lower depression 544.

Furthermore, the rotating cap 540 is coupled to the base plate 510 by fastening the fastening plate 550 to the lower surface of the rotating cap 540 with the base plate 510 interposed between the rotating cap 540 and the fastening plate 550.

For this, the rotating cap 540 is disposed on an upper surface of the base plate 510, and the fastening plate 550 is disposed under a lower surface of the base plate 510. in this state, fastening members 560 are fitted into respective fastening holes 542.

In other words, based on the base plate 510, the fastening plate 550 is disposed at the lower position, and the rotating cap 540 provided with the sleeve 530 and the ring 520 is placed on the upper surface of the base plate 510. Thereafter, the rotating cap 540 is coupled to the base plate 510 by fitting the fastening members 560 into the respective fastening holes 542 via the fastening plate 550.

Figure 37:
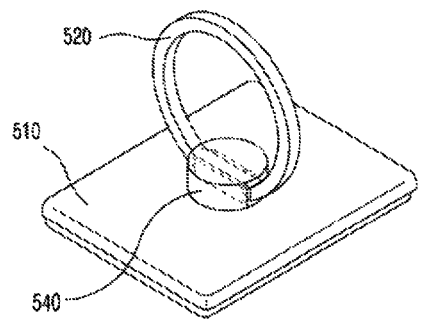
FIGS. 37 through 39 are views showing the operation or the portable electronic device holder according to the eighth embodiment of the present invention.
Figure 38:
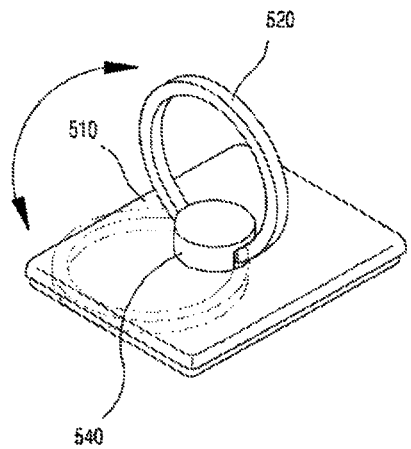
Figure 39:
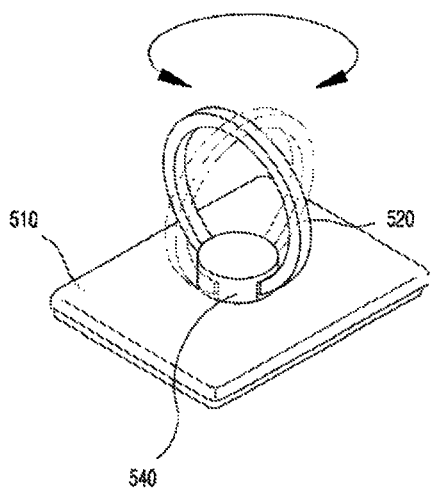

As shown in FIGS. 37 through 39, the ring 520 coupled to the rotating cap 540 on the base plate 510 can be rotated by 180²⁰ around the sleeve 530.

The ring 520 can be rotated by predetermined angles.

Furthermore, the ring 520 can be rotated around the rotating cap 540 by 360²⁰ on the rear surface ct the base plate 510.

Figure 40:
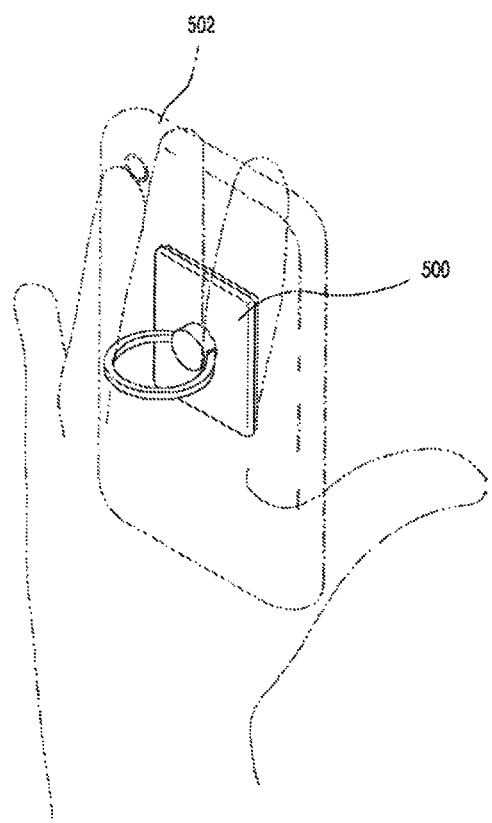
FIGS. 40 and 41 are views showing the usage of the portable electronic device holder according to the eighth embodiment of the present invention.

As shown in FIG. 40, using the ring 520 attached to the rear surface of the portable electronic device 502, the user places a finger in the ring 520 of the holder 500 and then is able to conveniently use the electronic device 502.

Figure 41:
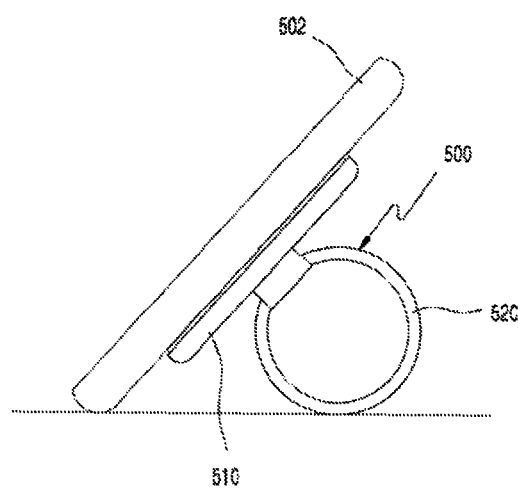

Referring to FIG. 41, the holder 500 provides supporting force using friction contact so that, when the electronic device 502 is placed on the support surface at a predetermined inclination angle, the holder 500 can support the electronic device 502 with predetermined supporting force.

Thereby, the electronic device 502 can be easily placed on the support surface such as an upper surface of a table at a predetermined inclination angle.

Figure 42:
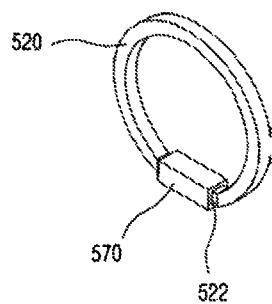
FIGS. 42 and 43 are views illustrating a fastening sleeve of the portable electronic device holder according to she eighth embodiment of the present invention.
Figure 43:
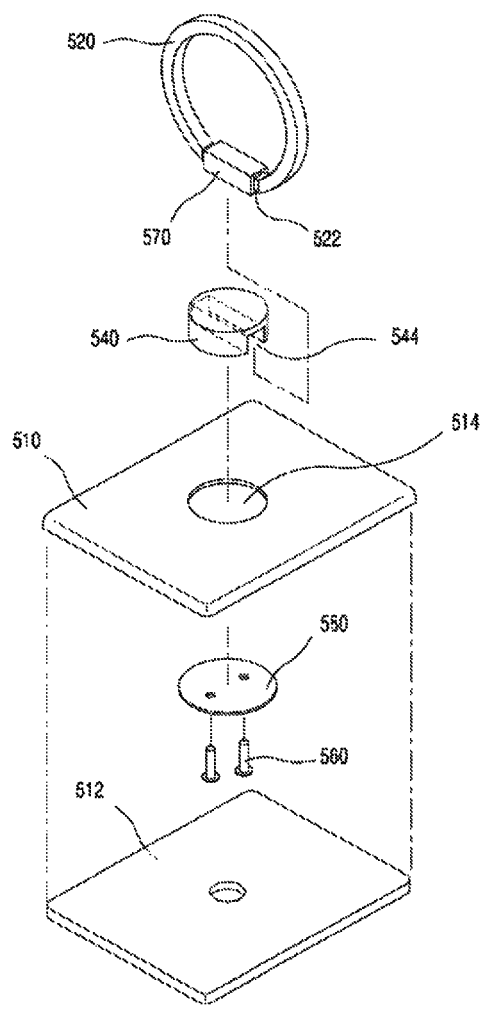

Referring to FIGS. 42 and 43, in a modification of the sleeve 530, a fixing sleeve 570 may be provided around the connection part 522 of the ring 520 in such a way that if covers the connect ion part 522.

The fixing sleeve 570 is made of rubber and covers the connection part 522 with a rectangular shape.

The fixing sleeve 570 that is integrally coupled to the connection part 522 of the ring 520 is installed in the lower depression 544 of the rotating cap 540.

As such, in this modification, because the fixing sleeve 570 is integrated with the connection part 522, the coupling of the ring to the lower depression 544 of the rotating cap 540 can be facilitated.

After the fixing sleeve 570 coupled to the connection part 522 of the ring 520 has been inserted into the lower depression 544 of the rotating cap 540, the rotating cap 540 is placed on the upper surface of the base plate 510 and is coupled to the base plate 510 in such a way that the fastening plate 550 is placed under the lower surface of the base plate 510 and the fastening members 560 are fitted into the respective fastening holes 542 via the fastening plate 550.

Figure 44A:
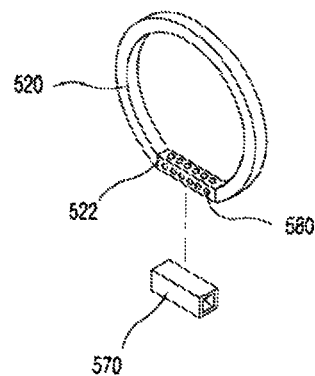
FIGS. 44a, 44b, and 45 are views illustrating protrusions formed on a portion of the portable electronic device holder according to the eighth embodiment of the present invention.
Figure 44B:
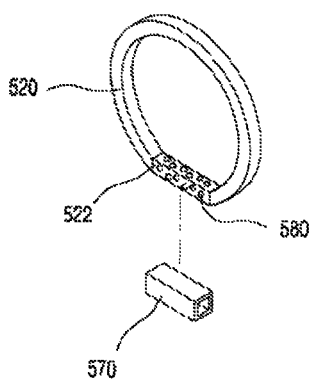
Figure 45:
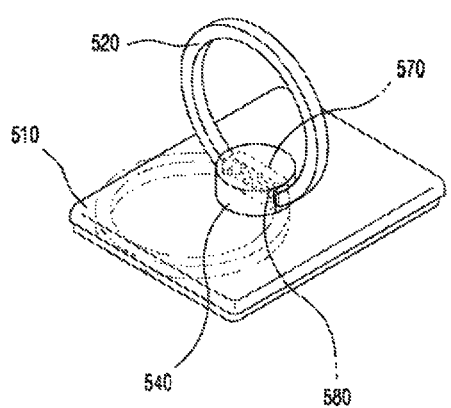

Meanwhile, referring to FIGS. 44a, 44b, and 45, in a modification of the connection part 522 of the ring 520, a plurality of protrusions 580 are provided on the connection part 522 of the ring 520.

The protrusions 580 may be arranged on each surface of the connection part 522 in such a way that they are aligned with each other. Alternatively, the protrusions 580 may be arranged in a zigzag manner in such a way that they are not aligned with each other.

A fixing sleeve 570 is provided around the connection part 522 provided with the protrusion 580. In this case of the holder 500, when the ring is rotated, friction is generated between the inner surface of the fixing sleeve 570 and the protrusions. Thereby, the rotation of the ring can be reliably adjusted by predetermined angles. Moreover, when the electronic device 502 is placed on the support surface at a predetermined inclination angle, the holder 500 can more reliably support the electronic device 502.

Although the preferred embodiments of the present invention have been disclosed for illustrative purposes, those skilled in the art will appreciate that the present invention is not limited to the constructions and operation illustrated in the embodiments, and various modifications, additions and substitutions are possible, without departing from the scope and spirit of the invention as disclosed in the accompanying claims. Therefore, these modifications, additions and substitutions must also be regarded as falling within the bounds of the present invention.

Industrial Applicability

The present invention provides a holder which is attached to the rear surface of a portable electronic device such as a smartphone, a tablet computer, etc. to enable a user to stably hold the portable electronic device.

The invention claimed is:

1. A holder for a portable electronic device, comprising:
a base plate having an adhesive pad on a lower surface thereof, the adhesive pad being removably attached to a rear surface of the portable electronic device;
a rotating plate coupled to the base plate so as to be rotatable in a horizontal direction and a coupling block integrally provided on a circumferential outer edge of the rotating plate, the coupling block having a lower depression therein, the lower depression having a polygonal cross-section and being open on a lower end and opposite sides thereof;
a ring integrally provided with a connection part having a polygonal cross-section corresponding to the polygonal cross-section of the lower depression; and
a rotating sleeve having an upper depression therein, the upper depression having a polygonal cross-section and being open on an upper end and opposite sides thereof so that the connection part of the ring is inserted into and coupled to the upper depression.

2. The holder according to claim 1, wherein the rotating sleeve coupled to the connection part of the ring is inserted into and fixed in the lower depression of the coupling block.

3. The holder according to claim 1, wherein the rotating plate is coupled to a coupling hole of the base plate by a fastening member having a vertical coupling structure, and
the coupling block is rotated around the rotating plate coupled to the fastening member.

* * * * *